(12) United States Patent
Chang et al.

(10) Patent No.: US 8,067,782 B2
(45) Date of Patent: Nov. 29, 2011

(54) LED PACKAGE AND LIGHT SOURCE DEVICE USING SAME

(75) Inventors: Chung-Min Chang, HsinChu (TW);
Chih-Peng Hsu, HsinChu (TW);
Chun-Wei Wang, HsinChu (TW)

(73) Assignee: Advanced Optoelectric Technology, Inc., Hsinchu Hsien (TW)

( * ) Notice: Subject to any disclaimer, the term of this patent is extended or adjusted under 35 U.S.C. 154(b) by 382 days.

(21) Appl. No.: 12/419,407

(22) Filed: Apr. 7, 2009

(65) Prior Publication Data
US 2009/0250709 A1 Oct. 8, 2009

(30) Foreign Application Priority Data

Apr. 8, 2008 (CN) .......................... 2008 1 0300870
May 23, 2008 (CN) .......................... 2008 1 0301758

(51) Int. Cl.
*H01L 31/0232* (2006.01)
*H01L 31/12* (2006.01)

(52) U.S. Cl. ... 257/99; 257/432; 257/434; 257/E33.058; 257/E33.072

(58) Field of Classification Search .................... 438/26, 438/40; 257/99, 100, 690, E33.055, E21.527
See application file for complete search history.

(56) References Cited

U.S. PATENT DOCUMENTS

| 7,166,873 B2 * | 1/2007 | Okazaki | 257/98 |
| 2007/0215895 A1 * | 9/2007 | Amoh et al. | 257/99 |

FOREIGN PATENT DOCUMENTS

CN 201004458 Y 1/2008

* cited by examiner

*Primary Examiner* — Zandra Smith
*Assistant Examiner* — Pamela E Perkins
(74) *Attorney, Agent, or Firm* — Altis Law Group, Inc.

(57) ABSTRACT

An exemplary LED package includes a dielectric plate, a heat conductor, a first planar electrode and a second planar electrode, a LED chip, and metal wires. The dielectric plate comprises a receiving groove defined therein. The heat conductor is positioned in the dielectric plate opposite to the receiving groove, and the heat conductor comprises a holding portion exposed on bottom of the receiving groove. The first and second planar electrodes are respectively received in the dielectric plate extending to the receiving groove and are spaced from the heat conductor. The first and second electrodes are respectively electrically connected to the LED chip by the metal wires. The LED chip is mounted on the holding portion of the heat conductor.

18 Claims, 14 Drawing Sheets

LED PACKAGE AND LIGHT SOURCE DEVICE USING SAME

BACKGROUND

1. Technical Field

The disclosure relates to light emitting diode (LED) packages with high heat-dissipation efficiency.

2. Description of Related Art

Light emitting diodes, and specifically the electrical and optical characteristics and lifespan thereof, are easily influenced by temperature. High working temperatures can deteriorate internal quantum efficiency of the LED and shorten the lifespan thereof. Furthermore, resistance of the semiconductor generates a negative temperature coefficient and tends to be reduced with an increase in the working temperature. Such reduced resistance correspondingly results in stronger current at given voltages as well as the generation of excessive heat. If the excessive heat is not effectively dissipated, heat accumulation can lead to deterioration of the LED.

Figure 14:
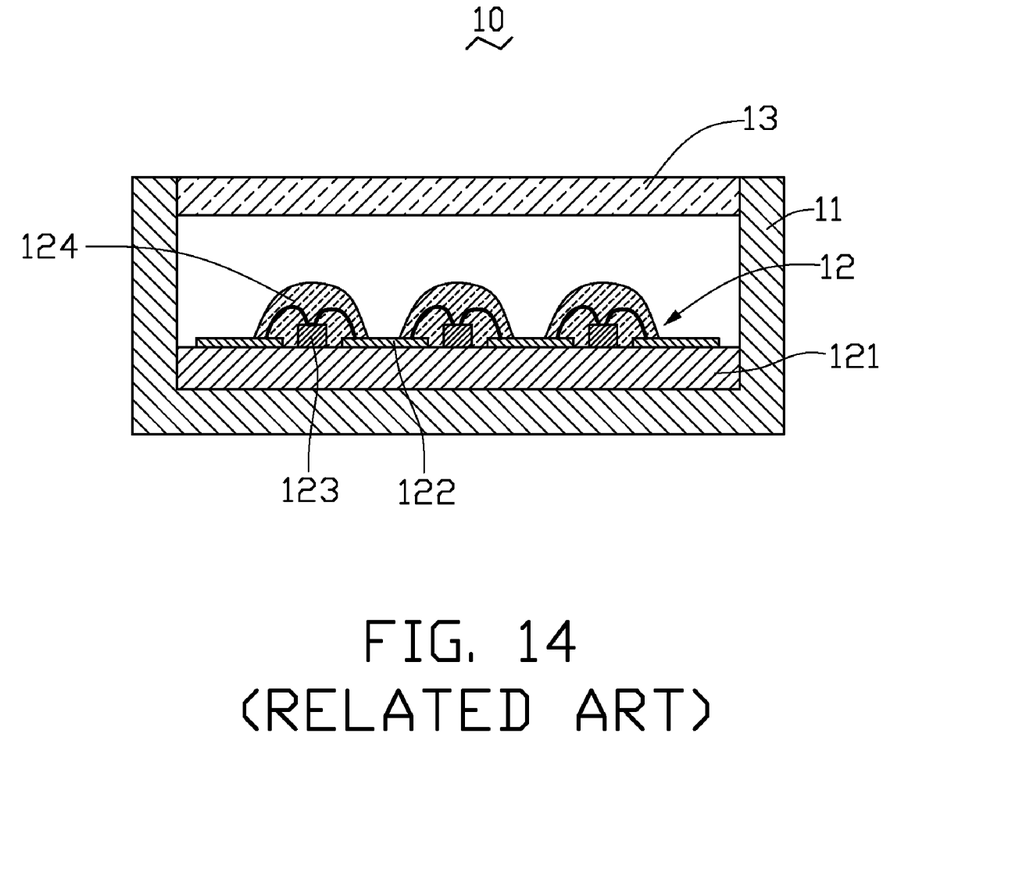
FIG. 14 is a schematic cross-section of a typical light source device, in accordance with the related art.

Referring to FIG. 14, a typical light source device 10 includes a shell 11, a light source module 12, and a cover 13. The light source module 12 is received in the shell 11. The cover 13 is located on and protects the light source module 12. The light source module 12 includes a printed circuit board 121, a circuit layer 122, a number of lighting elements 123 (such as light emitting diodes), and an encapsulant 124. The circuit layer 122 and lighting elements 123 are mounted on the printed circuit board 121. The lighting elements 123 are electrically connected to the circuit layer 122. The encapsulant 124 is positioned on the printed circuit board 121 to package the lighting elements 123. While excessive heat from lighting elements 123 is dissipated through the encapsulant 124 and the printed circuit board 121, thermal conductivity thereof is less than optimal, such that the excessive heat is not effectively dissipated.

Therefore, there is room for improvement within the art.

BRIEF DESCRIPTION OF THE DRAWINGS

Many aspects of the present LED package with high heat-dissipation efficiency can be better understood with reference to the following drawings. The components in the drawings are not necessarily drawn to scale, the emphasis instead being placed upon clearly illustrating the principles of the present LED package. Moreover, in the drawings, like reference numerals designate corresponding parts throughout the several views.

DETAILED DESCRIPTION

Figure 1:
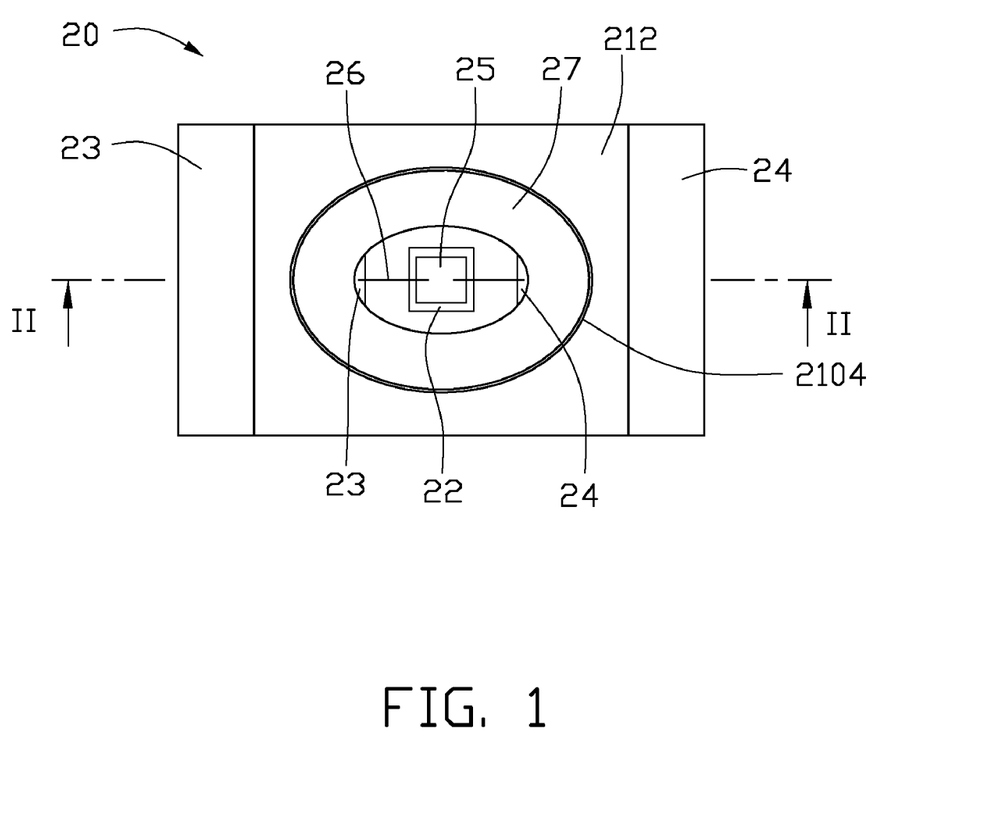
FIG. 1 is a schematic top plan view of a first exemplary embodiment of a LED package.
Figure 2:
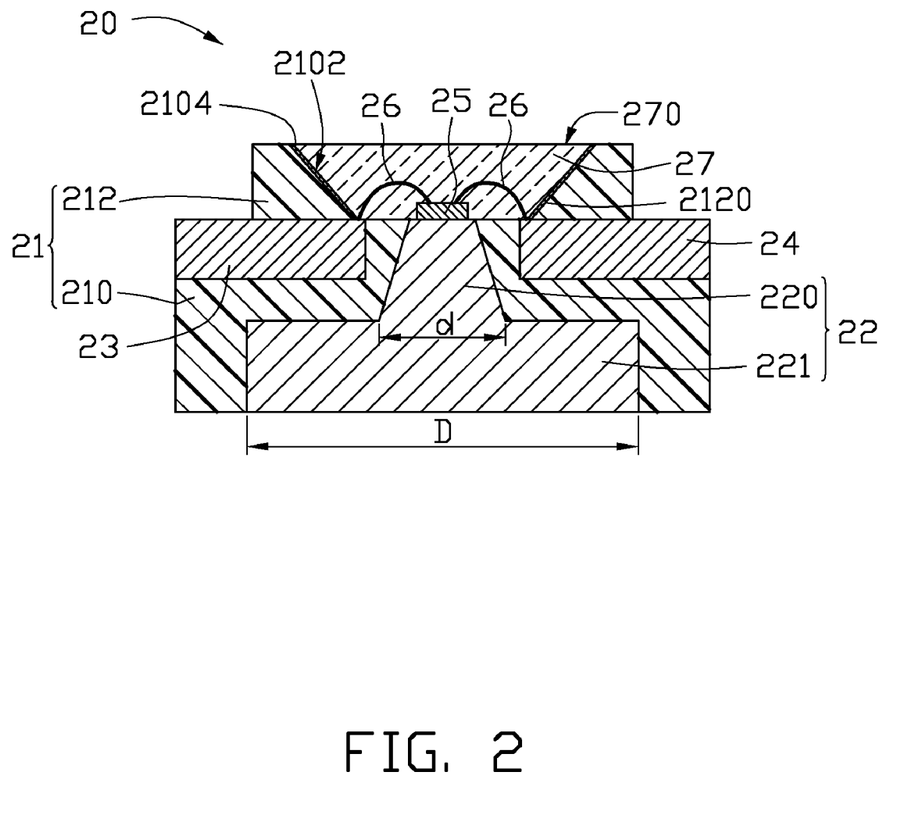
FIG. 2 is a schematic cross-section of the LED package in FIG. 1, along line II-II of FIG. 1.

Referring to FIGS. 1 and 2, a first exemplary embodiment of an LED package 20 is provided. The LED package 20 includes a dielectric plate 21, a heat conductor 22, a first electrode 23, a second electrode 24, a LED chip 25, and a number of metal wires 26.

The dielectric plate 21 includes a holding portion 210 and a light-reflecting portion 212 located thereon. The holding portion 210 and the light-reflecting portion 212 are integrally formed. The light-reflecting portion 212 defines a receiving groove 2120 extending to the holding portion 210, such that the holding portion 210 is exposed at the bottom of the receiving groove 2120. The light-reflecting portion 212 includes a reflective layer 2104 positioned in the receiving groove 2120 and located on a conical inner sidewall 2102 thereof. The dielectric plate 21 is electrically insulating, such as polyphthalamide (PPA), liquid crystal polymer (LCP) or others. Here, the dielectric plate 21 is an insulated substrate of polyphthalamide.

The heat conductor 22 is received in the holding portion 210 of the dielectric plate 21 along a direction close to the light-reflecting portion 212 at the bottom of the receiving groove 2120. The heat conductor 22 includes a holding portion 220 and an opposite bottom portion 221. The holding portion 220 is exposed on the bottom of the receiving groove 2120 for supporting the LED chip 25. Here, a width d of the holding portion 220 is less than a width D of the bottom portion 221. The heat conductor 22 is metal such as copper, aluminium or other, or heat-conducting material such as silicone, ceramic, or other.

The first and second electrodes 23, 24 are planar and seamless, such that strength and reliability thereof are optimized. One end of the first electrode 23 and one end of the second electrode 24 are respectively received in the dielectric plate 21 and located between the holding portion 210 and the light-reflecting portion 212 to extend into the receiving groove 2120, respectively exposed on the bottom of the receiving groove 2120. The other opposite ends of the first electrode 23 and the second electrode 24 extend out of the receiving groove 2120 to electrically connect to a power supply (not shown). The first electrode 23 and the second electrode 24 are insulated from the heat conductor 22. In addition, the first electrode 23 and the second electrode 24 are respectively positioned on lateral sides of the LED chip 25.

The LED chip 25 is mounted on the holding portion 220 of the heat conductor 22 and electrically connected to the first electrode 23 and the second electrode 24 respectively by the metal wires 26. The LED chip 25 is bonded with the holding portion 220 of the heat conductor 22 by conductive adhesive (such as silver colloid). It can be understood that the LED chip 25 may be connected with the holding portion 220 of the heat conductor 22 by eutectic bonding to form heat connection between the LED chip 25 and the heat conductor 22. The reflective layer 2104 positioned on the inner sidewall 2102 of the light-reflecting portion 212 collects light from the LED chip 25 and redirects it towards a top portion of the light-reflecting portion 212, to improve extraction efficiency of the LED chip 25. The LED chip 25 may be a blue LED chip, a red LED chip, a green LED chip, or an UV LED chip.

The LED package 20 further includes an encapsulant 27 positioned in the receiving groove 2120 of the dielectric plate 21, encapsulating the LED chip 25 and the metal wires 26 for protection from mechanical damage, moisture, and atmospheric exposure. A top surface 270 of the encapsulant 27 may be convex or concave to alter the angle of light exiting from the top surface 270, such that the illumination direction of the LED package 20 can be changed.

The encapsulant 27 may further include a plurality of phosphor particles doped therein. The phosphor particles are deposited on the LED chip 25 to surround it. For example, the LED chip 25 may be a blue LED chip and the phosphor particles a yellow phosphor, whereby the yellow phosphor, excited by blue light from the LED chip 25, emit yellow light, with white light formed by the combination of yellow and original blue light. The encapsulant 27 may be epoxy resin, silicone resin, or other electrically insulating transparent materials.

Here, the heat conductor 22, the first electrode 23 and the second electrode 24 are formed on the dielectric plate 21 by injection molding, so as to improve electrical insulation between the electrodes 23, 24 and the heat conductor 22. Because the LED chip 25 is directly mounted onto the heat conductor 22, heat from the LED chip 25 is effectively dissipated by the heat conductor 22 away from the LED chip 25, thereby heat-dissipation efficiency of the LED package 20 is optimized.

In addition, the electrodes 23, 24 at the top of the LED package 20 cooperatively supply electrical power to the LED chip 25, and the heat conductor 22 is positioned at bottom of the LED package 20, whereby the direction of current through the electrodes 23, 24 and the LED chip 25 is separate/distinct from the heat-dissipation route from the LED chip 25 to the heat conductor 22. Accordingly, thermal resistance of the LED package 20 is effectively decreased, resulting in improved heat-dissipation for the LED package 20.

Figure 3:
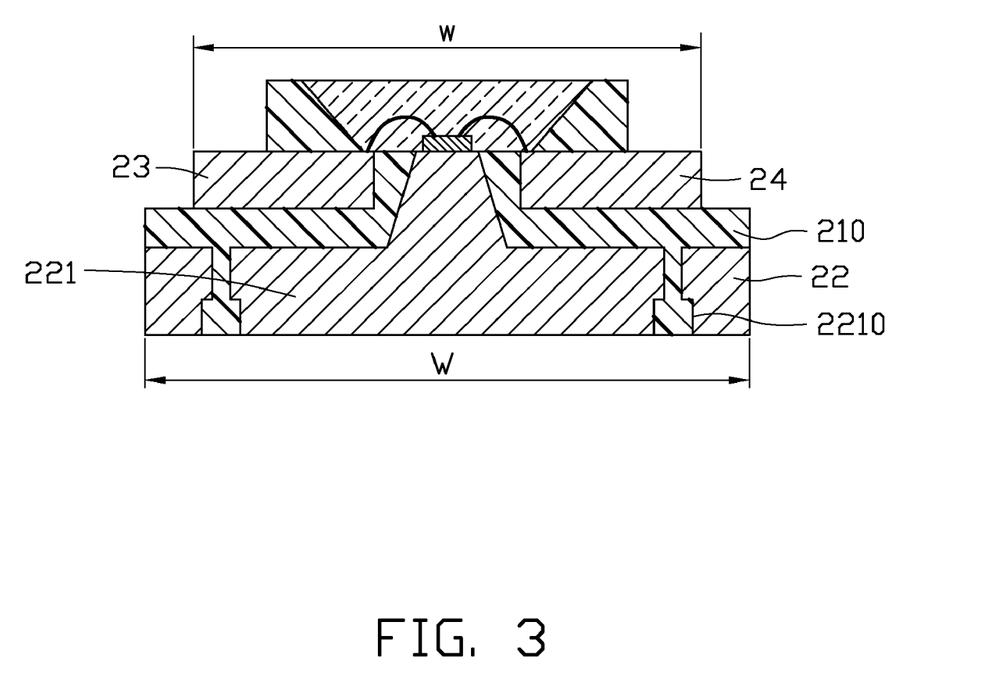
FIG. 3 is a schematic cross-section of the LED package in FIG. 1, showing a through hole in the heat conductor of the LED package.

Referring to FIG. 3, a number of step holes 2210 are respectively formed in the bottom portion 221 of the heat conductor 22, and part of the holding portion 210 can be filled in all the step holes 2210 when the heat conductor 22 is formed on the holding portion 210 by the injection molding, whereby contact area between the heat conductor 22 and the holding portion 210 is increased, and the heat conductor 22 contacts the dielectric plate 21 snugly. In addition, width W of the bottom portion 221 of the heat conductor 22 exceeds the width w of the combined electrodes 23, 24, effectively maximize heat-dissipation efficiency of the heat conductor 22.

Figure 4:
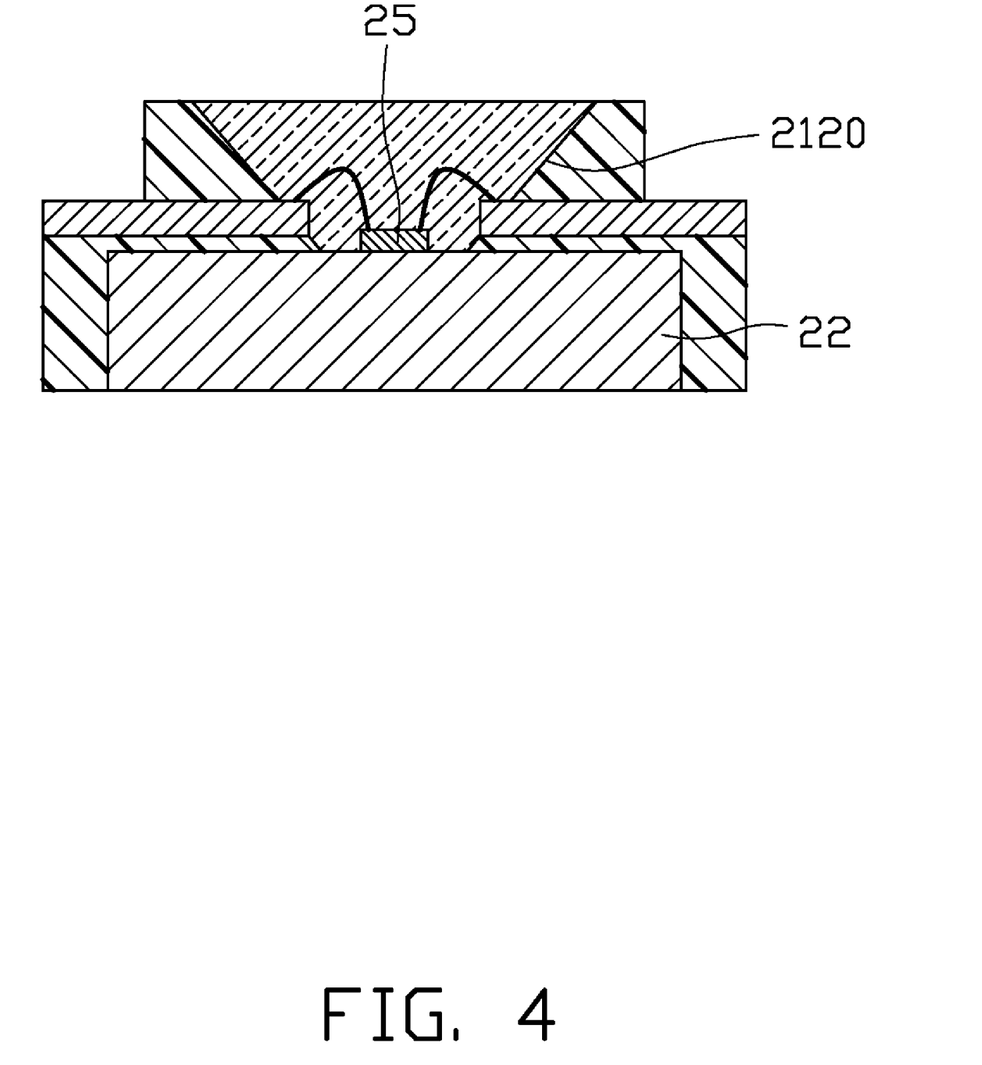
FIG. 4 is a schematic cross-section of the LED package in FIG. 1, showing a cubic structure of the heat conductor.

Referring to FIG. 4, the heat conductor 22 is cubic and partly exposed on the bottom of the receiving groove 2120. The LED chip 25 is mounted on the heat conductor 22, thermally connecting with the heat conductor 22, thus the LED chip 25 is located at bottom of the receiving groove 2120.

Figure 5:
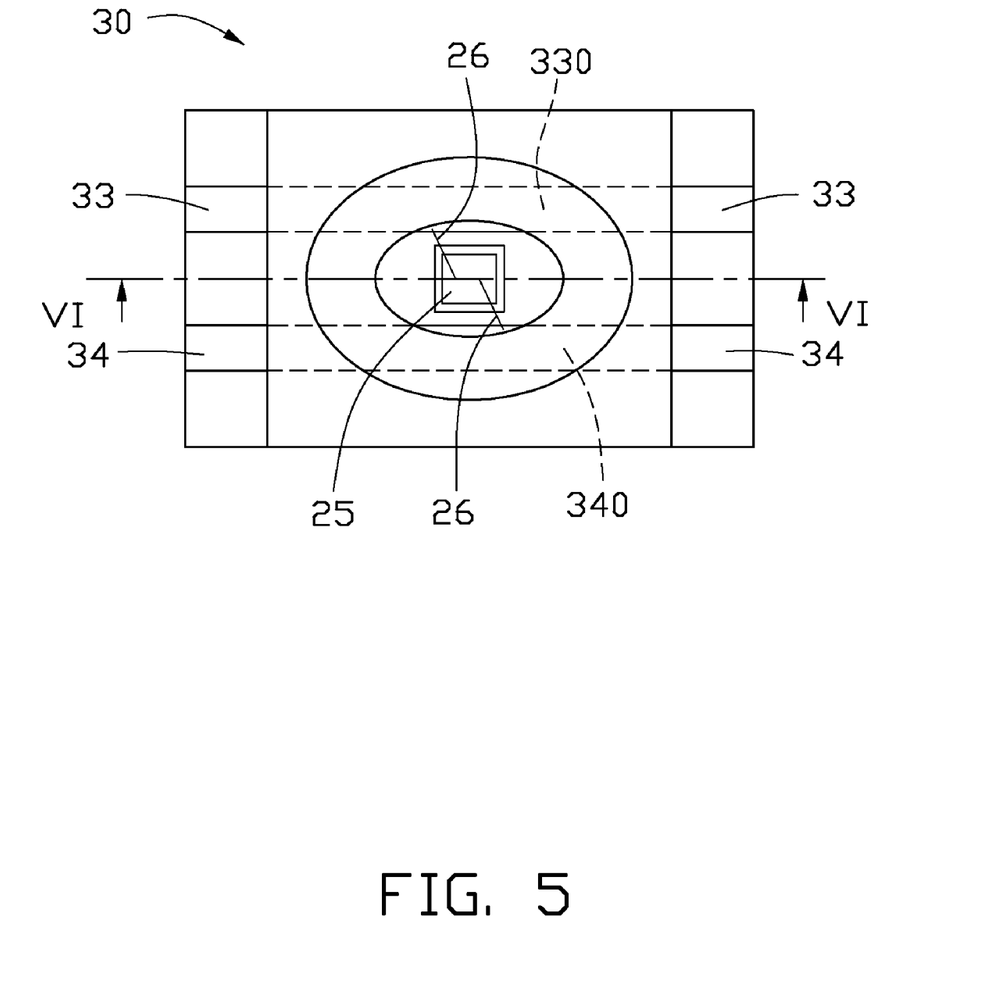
FIG. 5 is a schematic top plan view of a second exemplary embodiment of a LED package.
Figure 6:
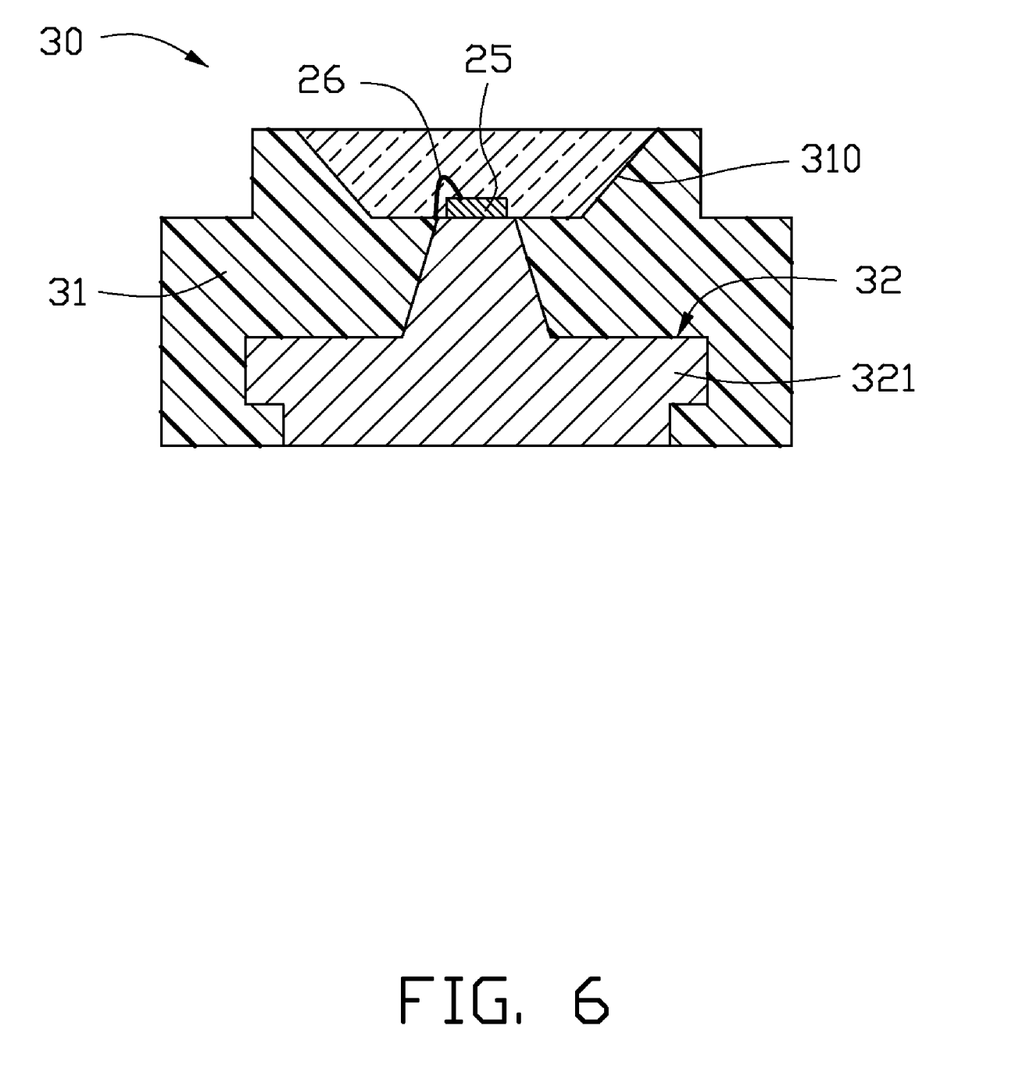
FIG. 6 is a schematic cross-section of the LED package in FIG. 5, along line VI-VI of FIG. 5.

Referring to FIGS. 5 and 6, a LED package 30, in accordance with a second exemplary embodiment, is provided, differing from that of the previous exemplary embodiment in that electrodes 33, 34 are longitudinal and respectively positioned at opposite sides of the LED chip 25. A middle portion 330 of the first electrode 33 and a middle portion 340 of the second electrode 34 are both exposed on the receiving groove 310. Two ends of the first electrode 33 and the two ends of the second electrode 34 respectively extend out of the receiving groove 3 10.

The bottom 321 of the heat-conductor 32 is T-shaped to increase contact area between the heat conductor 32 and the dielectric plate 31, and the heat conductor 32 contacts the dielectric plate 31 snugly. Furthermore, two ends of the first electrode 33 and two ends of the second electrode 34 respectively extend out of the receiving groove 310, to simply connect with a circuit board in parallel or series. Thereby, practicality of assembly of the LED package 30 is enhanced.

Figure 7:
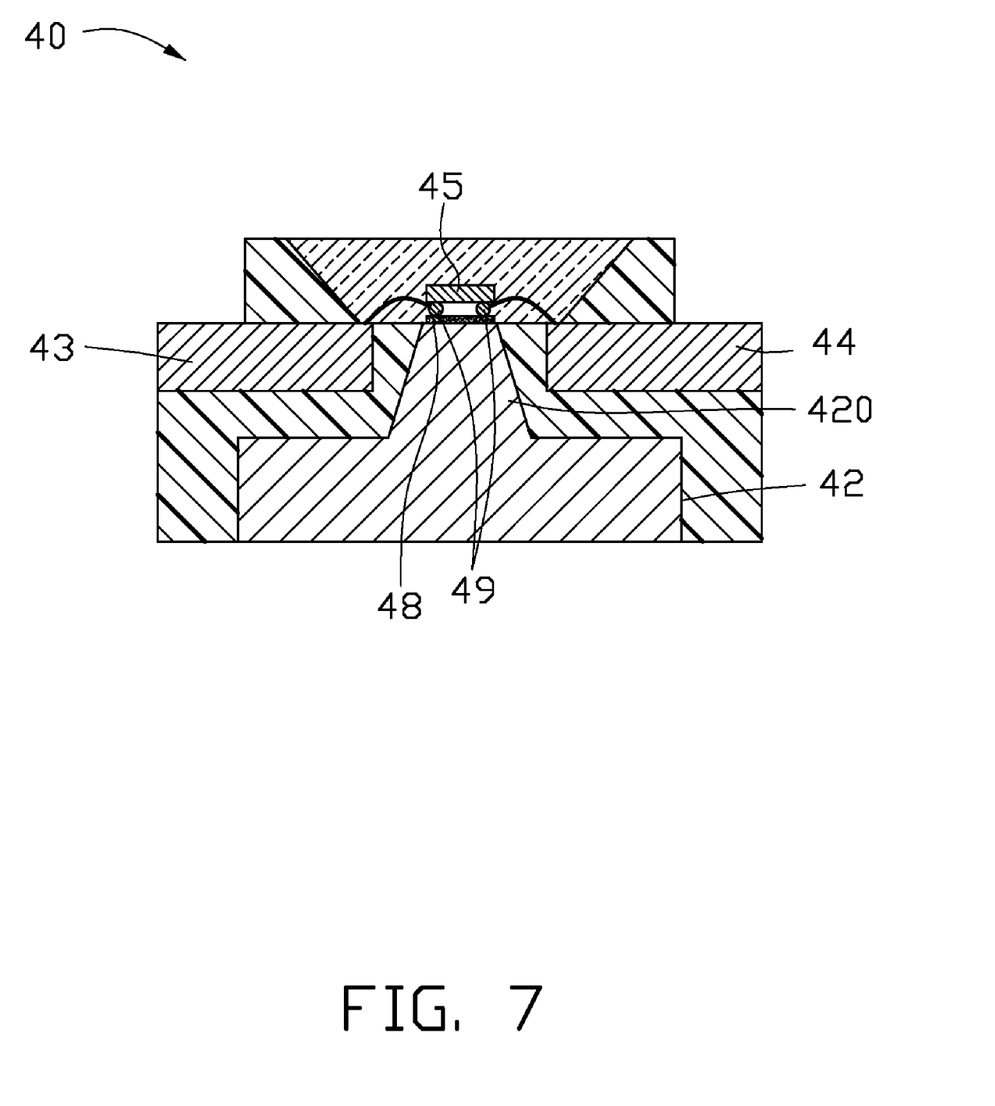
FIG. 7 is a schematic cross-section of a third exemplary embodiment of a LED package.

Referring to FIG. 7, a LED package 40, in accordance with a third exemplary embodiment, is provided, differing from that of the first exemplary embodiment in that LED package 40 further includes a submount 48 positioned on the holding portion 420 of the heat conductor 42. The submount 48 is bonded to the holding portion 420 of the heat conductor 42 by conductive adhesive (such as silver colloid), or alternatively by eutectic bonding, forming a heat connection therebetween. The submount 48 may be ceramic material, diamond like carbon, ceramic aluminum substrate, or silicon. The ceramic material can be silicon nitride, alundum, beryllium oxide, or other.

The LED chip 45 is flip-chip bonded on the submount 48 by two electrical contacts 49. The electrical contacts 49 respectively contact parallel positive and negative electrodes of the LED chip 45. The two electrical contacts 49 are electrically connected with the first electrode 43 and the second electrode 44 by metal wires.

Figure 8:
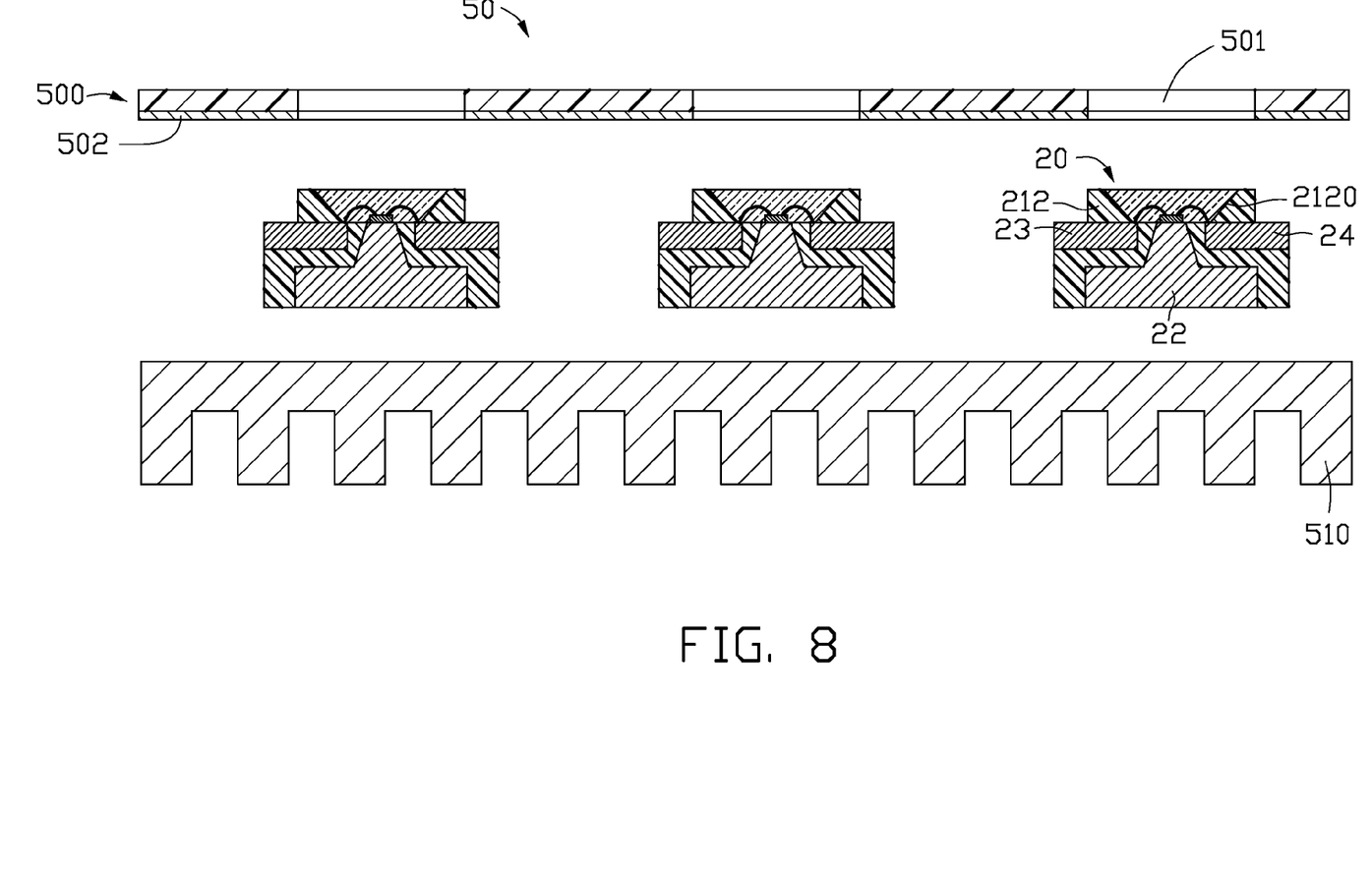
FIG. 8 is a disassembled, schematic cross-section of a first exemplary embodiment of a light source device.

Referring to FIG. 8, a first exemplary embodiment of a light source device 50 is provided. The light source device 50 includes a circuit board 500, a plurality of LED packages 20 similar to those of the first exemplary embodiment, and heat-dissipating fins 510.

The circuit board 500 comprises a plurality of through holes 501 defined therein, and a metal layer 502 formed on a surface of the circuit board 500 between two adjacent through holes. Light-reflecting portions 212 of the LED packages 20 are respectively received in the through holes 501, such that the first electrode 23 and the second electrode 24 electrically connect to the metal layer 502.

Heat-dissipating fins 510 disposed on one side of the LED packages 20 extend away from the circuit board 500. The heat-dissipating fins 510 are thermally connected to the heat conductors 22 of the LED packages 20 and are configured (i.e., structured and arranged) for facilitating the dissipation of heat from the LED packages 20.

Because the LED packages 20 are sandwiched between the circuit board 500 and the heat-dissipating fins 510, and the electrodes 23, 24 of each LED package 20 directly contact the metal layer 502 of the circuit board 500, the electrodes 23, 24 are located at the top of the LED packages 20, and the heat conductor 22 is positioned at the bottom. Therefore, the direction of current through the electrodes 23, 24 is separated/distinct from the heat-dissipation direction to the heat conductors 22. Thermal resistance of the LED packages 20 is reduced accordingly, maximizing heat-dissipation of the light source device 50.

The LED package of the second or third exemplary embodiment can be included in the fourth exemplary embodiment rather than the LED package 20.

Figure 9:
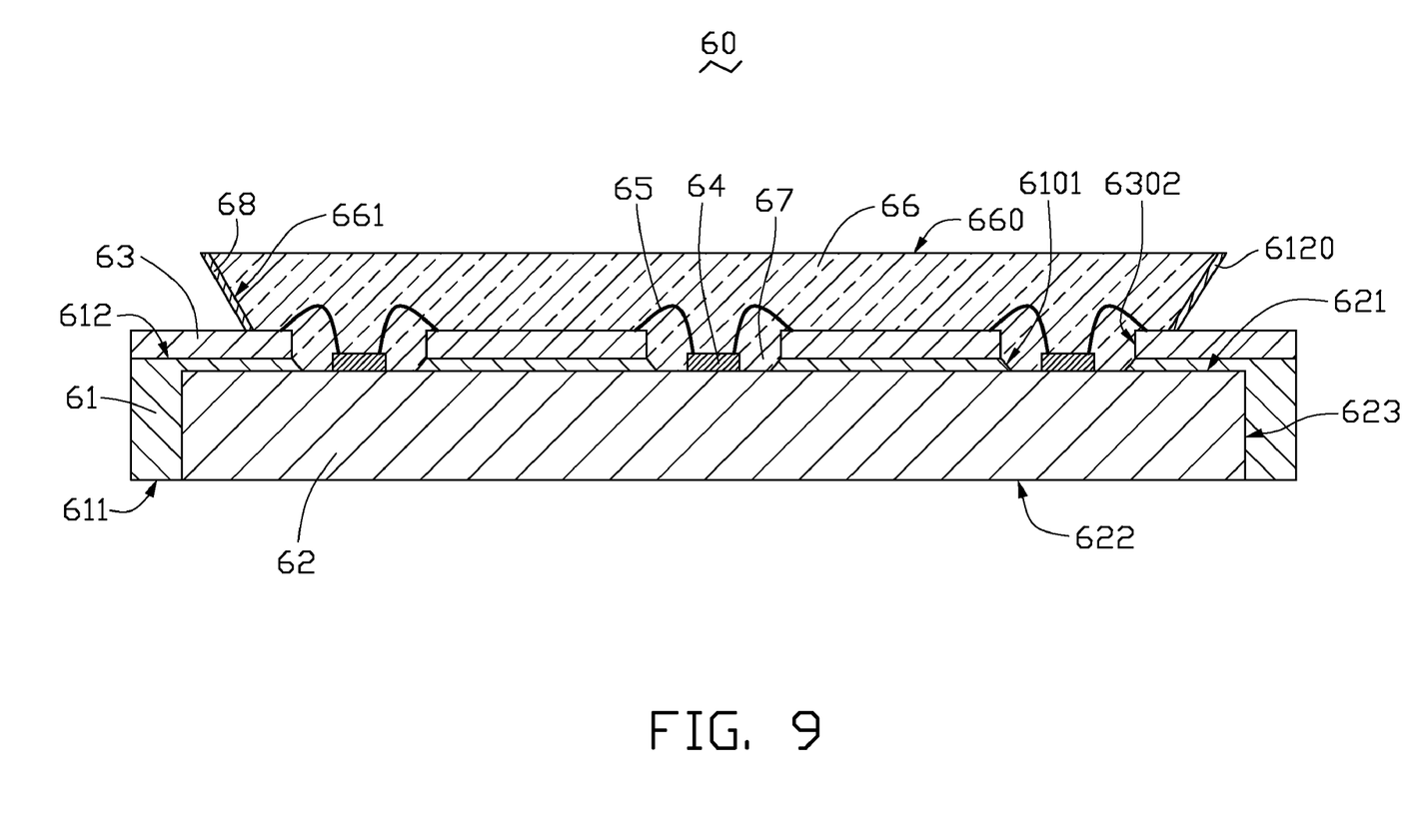
FIG. 9 is a schematic cross-section of a fourth exemplary embodiment of a LED package.

Referring to FIG. 9, a LED package 60, in accordance with a fourth exemplary embodiment, is provided. The LED package 60 includes a dielectric plate 61, a heat conductor 62, a metal layer 63, many LED chips 64, metal wire 65, and an encapsulant 66.

The dielectric plate 61 includes a first surface 611 and an opposite second surface 612, and the first surface 611 is located on bottom the LED package 60. The dielectric plate 61 further includes a plurality of first through holes 6101 on the second surface 612. The dielectric plate 61 is electrically-insulating, such as polyphthalamide (PPA), liquid crystal polymer (LCP) or others. Here, the dielectric plate 21 is an insulated substrate of polyphthalamide.

The heat conductor 62 is cubic, and includes an upper surface 621, a lower surface 622, and a side surface 623 located therebetween. The heat conductor 62 is received in the dielectric plate 61, such that the upper and side surfaces 621, 623 are in tight contact with the dielectric plate 61.

The upper surface 621 of the heat conductor 62 is partly exposed on the first through holes 6101, thereby defining a number of receiving grooves 67 on the heat conductor 62. The lower surface 622 of the heat conductor 62 is exposed to the air. The heat conductor 62 can be metal, silicon or ceramic, such as copper, aluminium, or other The metal layer 63 is positioned on the second surface 612 of the dielectric plate 61, and defines a number of second through holes 6302 respectively communicating with the first through holes 6101. The metal layer 63 is planar and seamless, such that fracture of the metal layer 63 is avoided, and reliability improved.

Here, the metal layer 63, the heat conductor 62 and the dielectric plate 61 are integrally formed by injection molding, so as to improve electrical insulation between the metal layer 63 and the heat conductor 62, and heat conduction between the heat conductor 62 and dielectric plate 61.

Due to being respectively received in the receiving grooves 67, the LED chips 64 directly contact the exposed holding portion of the heat conductor 62, and heat from the LED chips 64 can be effectively dissipated by the heat conductor 62 away from the LED chips 64. Thereby, heat-dissipation efficiency of the LED package 60 is improved.

The LED chips 64 are bonded with the heat conductor 62 by conductive adhesive (such as silver colloid), or, alternatively, by eutectic bonding to form heat connection between the LED chips 64 and the heat conductor 62. An anode and a cathode of the LED chip 64 can be electrically connected to the metal layer 63 by metal wires 65.

It can be understood that, the LED package 60 may include at least one blue LED chip, at least one red LED chip, and at least one green LED chip. Light respectively emitting from the blue, red and green chips combines to provide white light.

The encapsulant 66 is positioned on the second surface 612 of the dielectric plate 61, encapsulating the LED chips 64 and the metal wires 65 for protection from mechanical damage, moisture, and atmospheric exposure. A top surface 660 of the encapsulant 66 may be convex or concave for changing the angle of the light emitted from the top surface 660, such that the area illuminated by the LED package 60 can be altered.

The encapsulant 66 may further include a plurality of phosphor particles doped therein. The phosphor particles are deposited on and surround the LED chips 64, and can include red phosphor, green phosphor and blue phosphor, respectively excited by red light, green light and blue light from the corresponding LED chips. As an example, yellow phosphor excited by blue light from at least one of the LED chips 64 emits yellow light, with white light generated by combination thereof with existing blue light. The encapsulant 66 may be epoxy resin, silicone resin, or other electrically insulating transparent materials. In addition, the encapsulant 66 may further include a plurality of light scattering particles evenly dispersed therein to scatter light from the LED chips 64.

The LED package 60 may further include a reflective cup 68 on the second surface 612 of the dielectric plate 61 to receive the encapsulant 66 therein, and sidewall 661 of the encapsulant 66 contacts the reflective cup 68. Light incident on the reflective cup 68 is collected and redirected towards a top portion of the reflective cup 68, to improve extraction efficiency of the LED chips 64.

Figure 10:
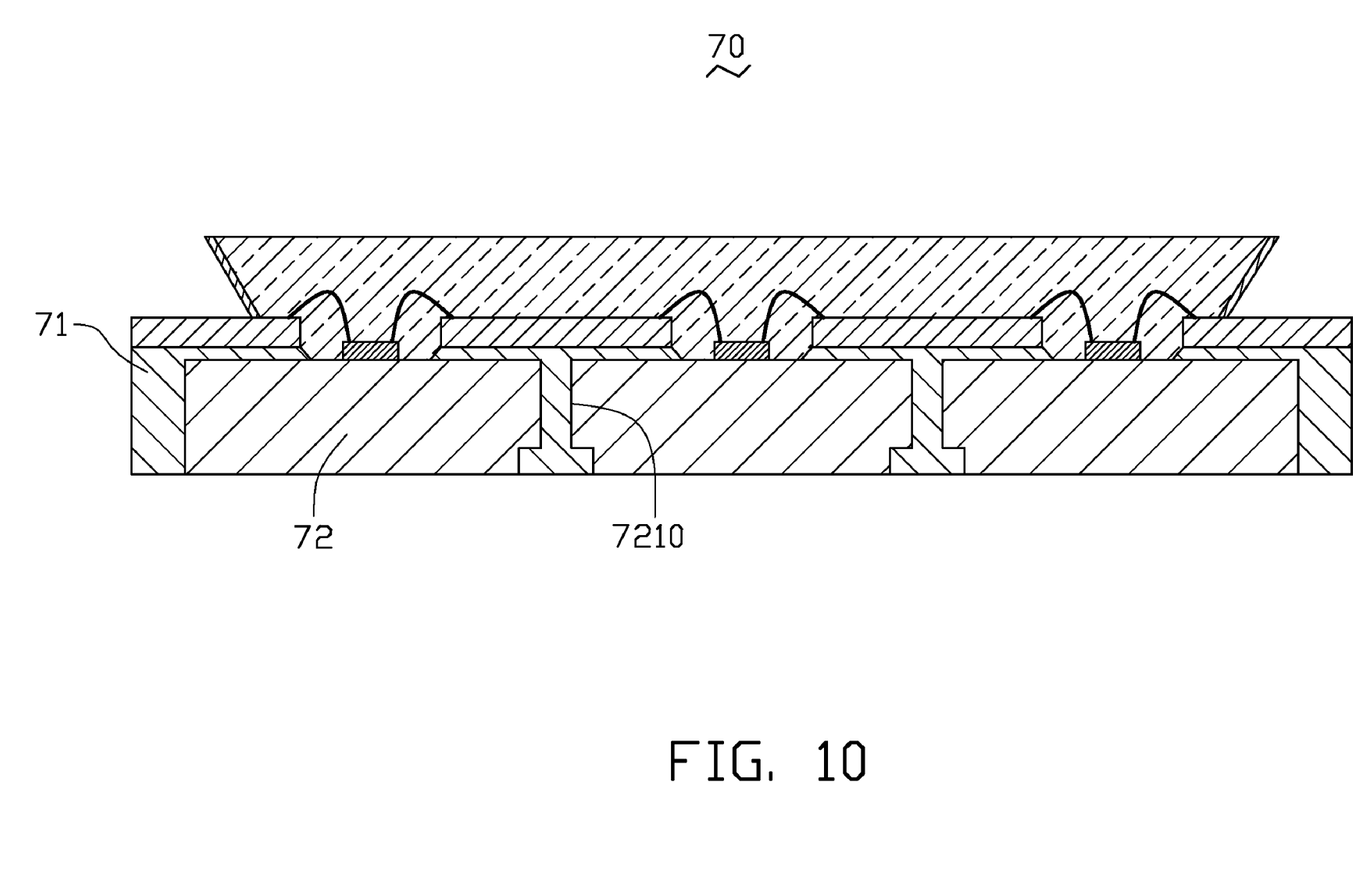
FIG. 10 is a schematic cross-section of a fifth exemplary embodiment of a LED package.

Referring to FIG. 10, a LED package 70, in accordance with a fifth exemplary embodiment, is provided. The LED package 70 is similar to the LED package 60 of the fifth exemplary embodiment, and there has the following difference between them.

A plurality of step holes 7210 are respectively defined in the heat conductor 72, with part of the dielectric plate 71 filled in all the step holes 7210 when the heat conductor 72 is received in dielectric plate 71 by injection molding, such that contact area between the dielectric plate 71 and the heat conductors 72 is increased, and the heat conductors 72 contact the dielectric plate 71 snugly.

Figure 11:
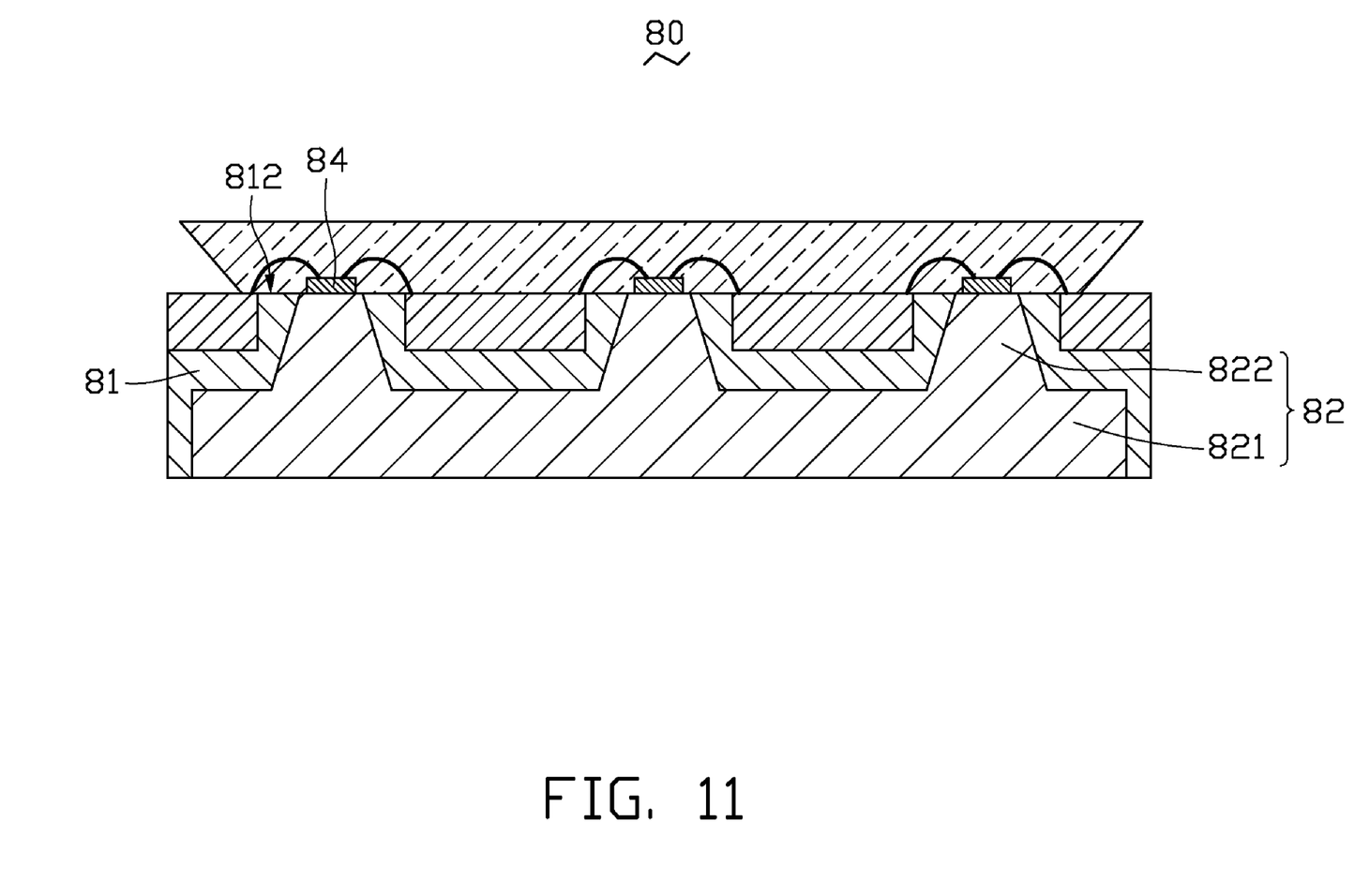
FIG. 11 is a schematic cross-section of a sixth exemplary embodiment of a LED package.

Referring to FIG. 11, a LED package 80, in accordance with a sixth exemplary embodiment, is provided. The LED package 80 is similar to the LED package 60 of the fifth exemplary embodiment, differeing in that heat conductor 82 includes a bottom portion 821 and a plurality of opposite holding portions 822. Each of the holding portions 822 is exposed on second surface 812 of the dielectric plate 81 for supporting a LED chip 84.

Figure 12:
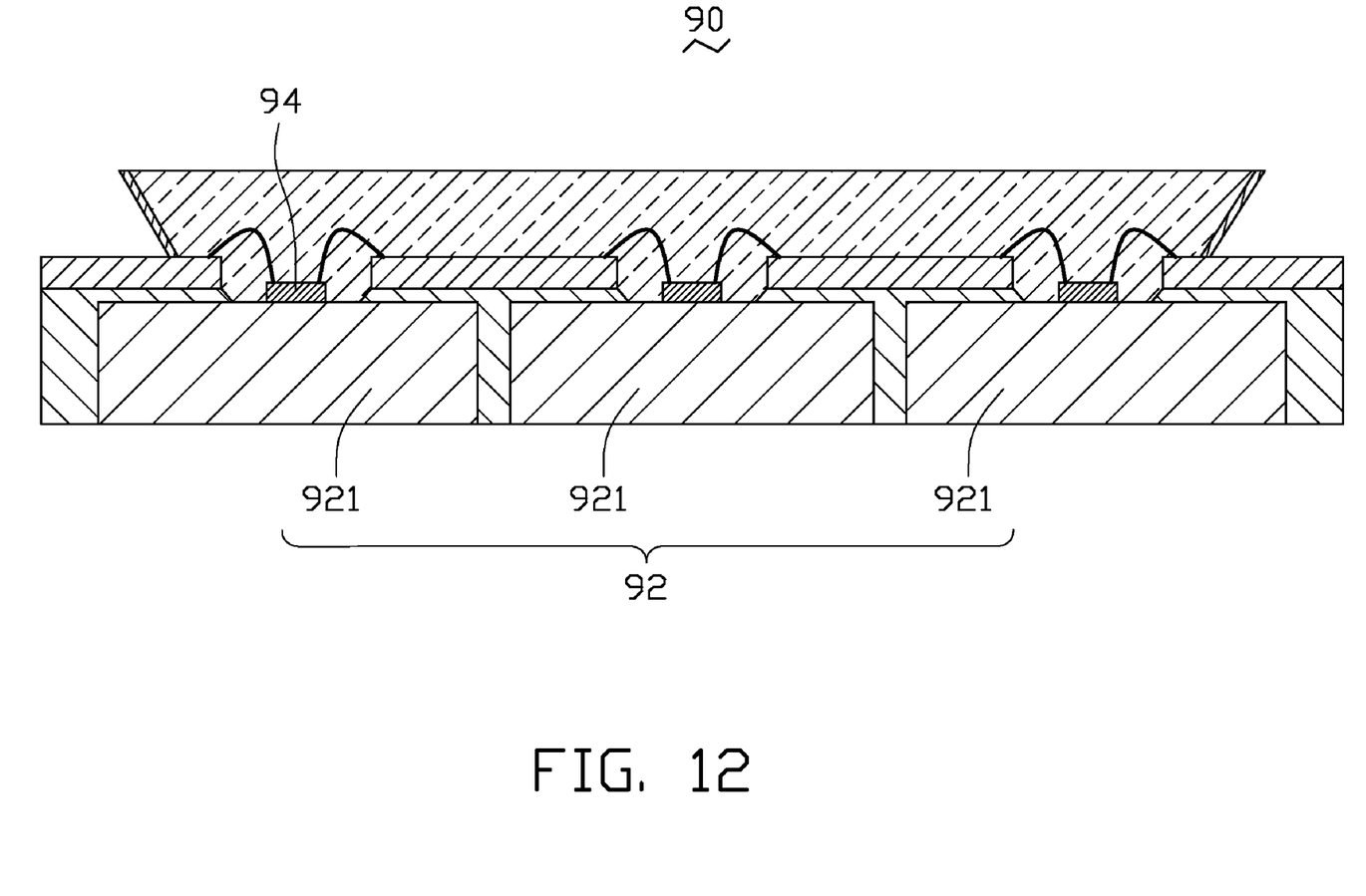
FIG. 12 is a schematic cross-section of a seventh exemplary embodiment of a LED package.

Referring to FIG. 12, a LED package 90, in accordance with a seventh exemplary embodiment, is provided. The LED package 80 is similar to the LED package 60 of the fifth exemplary embodiment, differing in that heat conductor 92 includes a number of separate parts 921 each configured for holding one corresponding LED chip 94.

Figure 13:
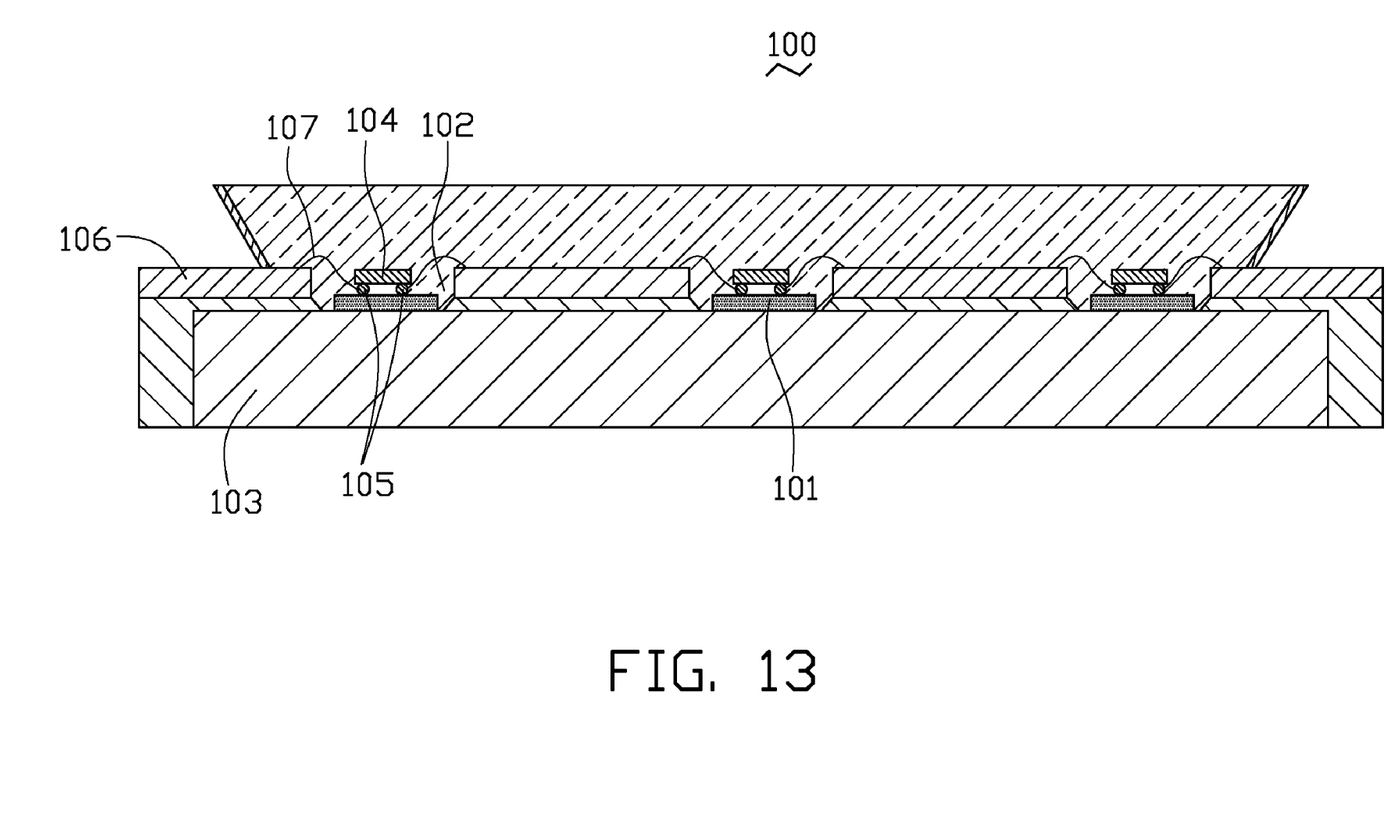
FIG. 13 is a schematic cross-section of an eighth exemplary embodiment of a LED package.

Referring to FIG. 13, a LED package 100, in accordance with an eighth exemplary embodiment, is provided, differing from the first exemplary embodiment in that LED package 100 further includes a number of submounts 101 respectively located in the receiving grooves 102 and positioned on the heat conductor 103. The submount 101 is bonded with the heat conductor 103 by conductive adhesive (such as silver colloid), or by eutectic bonding to form heat connection between the submount 101 and the heat conductor 103. The submount 101 may be ceramic material, diamond like carbon, ceramic aluminum substrate,or silicon. The ceramic material can be silicon nitride, alundum, or beryllium oxide or other.

Each of the LED chips 104 is flip-chip bonded on one of the submounts 101 by two electrical contacts 105. The electrical contacts 105 respectively contact parallel positive and negative electrodes of the LED chip 104. The two electrical contacts 105 electrically connect with the metal layer 106 by metal wires 107.

It is believed that the present exemplary embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the disclosure.

What is claimed is:

1. A LED package, comprising:
   a dielectric plate defining a receiving groove therein;
   a heat conductor being positioned in the dielectric plate opposite to the receiving groove, the heat conductor having a holding portion exposed at the bottom of the receiving groove, the heat conductor further comprising a bottom portion opposite to the holding portion, a width of the holding portion being less than a width of the bottom portion of the heat conductor;
   a first planar electrode and a second planar electrode being respectively received in the dielectric plate extending to the receiving groove and being spaced from the heat conductor;

a LED chip being mounted on the holding portion of the heat conductor; and metal wires, the first and second electrodes being respectively electrically connected to the LED chip by the metal wires.

2. The LED package of claim 1, wherein the dielectric plate comprises a holding portion and a light-reflecting portion being integrally formed with the holding portion, the light-reflecting portion is located at one side of the holding portion, the receiving groove is located in the light-reflecting portion and extending to the holding portion, one end of the first electrode and one end of the second electrode are respectively received in the dielectric plate and located between the holding portion and the light-reflecting portion to extend into the receiving groove.

3. The LED package of claim 1, further comprising an encapsulant, the encapsulant positioned in the receiving groove of the dielectric plate configured for encapsulating the LED chip and the metal wires.

4. The LED package of claim 1, wherein the width of the bottom portion of the heat conductor is great than a total width of the first and second electrodes.

5. The LED package of claim 1, further comprising heat-dissipating fins thermally connected to the heat conductor.

6. The LED package of claim 1, wherein the first and second electrodes are longitudinal respectively positioned at opposite sides of the LED chip, a middle portion of the first electrode and a middle portion of the second electrode are both exposed on the receiving groove, two ends of the first electrode and the two ends of the second electrode respectively extend out of the receiving groove.

7. The LED package of claim 1, wherein the LED chip is flip-chip bonded on the holding portion of the heat conductor and is electrically connected to the first and second electrodes.

8. A LED package comprising:
a dielectric plate, the dielectric plate includes a first surface and an opposite second surface, and a plurality of first through holes on the second surface;
a heat conductor being in contact with the first surface of the dielectric plate and comprises holding portion which is exposed on the first through holes;
a planar metal layer positioned on the second surface of the dielectric plate and defines a plurality of second through holes which respectively communicating with the first through holes;
a plurality of LED chips positioned on the holding portion of the heat conductor and being thermally connected to the heat conductor; and
an encapsulant positioned in the receiving groove of the dielectric plate configured for encapsulating the LED chips and the metal wires;
wherein the LED chips comprise at least one UV LED chip.

9. The LED package of claim 8, wherein the heat conductor comprises an upper surface, an opposite lower surface, and a side surface sandwiched between the upper and lower surface, the upper and side surfaces are in tight contact with the dielectric plate, and the upper surface of the heat conductor is partly exposed on the first through holes.

10. The LED package of claim 8, wherein the metal layer, the heat conductor, and the dielectric plate are integrally formed by injection molding.

11. The LED package of claim 8, wherein the heat conductor comprises a plurality of separate cubic elements.

12. The LED package of claim 8, wherein the heat conductor comprises a bottom portion and a plurality of opposite holding portions, each of the holding portions is exposed on the second surface of the dielectric plate for supporting a LED chip.

13. The LED package of claim 8, wherein the heat conductor comprises a plurality of through holes therein, and parts of the dielectric plate are respectively filled in the through holes.

14. The LED package of claim 8, further comprising a reflective cup located on the second surface of the dielectric plate to receive the encapsulant therein.

15. The LED package of claim 14, wherein the heat conductor, the dielectric plate, the metal layer, and the reflective cup are integrally formed by injection molding.

16. The LED package of claim 8, wherein the LED chips are respectively flip-chip bonded on the heat conductor and electrically connected to the metal layer.

17. A light source device comprising:
a LED package, comprising:
a dielectric plate defining a receiving groove therein;
a heat conductor being positioned in the dielectric plate opposite to the receiving groove, the heat conductor having a holding portion exposed at the bottom of the receiving groove, the heat conductor further comprising a bottom portion opposite to the holding portion, a width of the holding portion being less than a width of the bottom portion of the heat conductor;
a first planar electrode and a second planar electrode being respectively received in the dielectric plate extending to the receiving groove and being spaced from the heat conductor;
a LED chip being mounted on the holding portion of the heat conductor;
metal wires, the first and second electrodes being respectively electrically connected to the LED chip by the metal wires; and
a circuit board comprising a through hole defined therein and a metal layer formed thereon, the receiving groove of the dielectric plate is received in the through hole, and the first electrode and the second electrode of the LED package are electrically connected to the metal layer.

18. The LED package of claim 17, further comprising heat-dissipating fins thermally connected to the heat conductor.

* * * * *